United States Patent
Kim et al.

(10) Patent No.: US 10,332,740 B2
(45) Date of Patent: Jun. 25, 2019

(54) METHOD OF MANUFACTURING A SEMICONDUCTOR DEVICE AND A CLEANING COMPOSITION FOR AN ADHESIVE LAYER

(71) Applicants: Samsung Electronics Co., Ltd., Suwon-si (KR); Soulbrain Co., Ltd., Seongnam-si (KR)

(72) Inventors: Hoyoung Kim, Hwaseong-si (KR); Hyo-Sun Lee, Hwaseong-si (KR); Soojin Kim, Seoul (KR); Keonyoung Kim, Seongnam-si (KR); Jinhye Bae, Suwon-si (KR); Hoon Han, Anyang-si (KR); Tae Soo Kwon, Seongnam-si (KR); Jung Hun Lim, Seongnam-si (KR)

(73) Assignees: SAMSUNG ELECTRONICS CO., LTD., Samsung-ro, Yeongtong-gu, Suwon-si, Gyeonggi-do (KR); SOULBRAIN CO., LTD., Seongnam-Si, Gyeonggi-Do (KR)

( * ) Notice: Subject to any disclaimer, the term of this patent is extended or adjusted under 35 U.S.C. 154(b) by 0 days.

(21) Appl. No.: 15/841,946

(22) Filed: Dec. 14, 2017

(65) Prior Publication Data
US 2018/0211830 A1   Jul. 26, 2018

(30) Foreign Application Priority Data
Dec. 14, 2016   (KR) .................. 10-2016-0170557

(51) Int. Cl.
  *H01L 21/44*   (2006.01)
  *H01L 21/02*   (2006.01)
  (Continued)

(52) U.S. Cl.
  CPC .......... *H01L 21/02068* (2013.01); *C11D 7/08* (2013.01); *C11D 7/261* (2013.01);
  (Continued)

(58) Field of Classification Search
  CPC ..... H01L 21/02068; C11D 7/08; C11D 7/261; C11D 7/264; C11D 7/266
  (Continued)

(56) References Cited

U.S. PATENT DOCUMENTS 7,951,765 B2   5/2011   Kim et al.
8,685,909 B2   4/2014   Angst et al.
(Continued)

FOREIGN PATENT DOCUMENTS

JP   2014-133855 A   7/2014
KR   10-0503268 B1   7/2005
(Continued)

*Primary Examiner* — David S Blum
(74) *Attorney, Agent, or Firm* — Muir Patent Law, PLLC

(57) ABSTRACT

Embodiments of the inventive concepts provide a method of manufacturing a semiconductor device and a cleaning composition for an adhesive layer. The method includes preparing a semiconductor substrate to which an adhesive layer adheres, removing the adhesive layer from the semiconductor substrate, and applying a cleaning composition to the semiconductor substrate to remove a residue of the adhesive layer. The cleaning composition includes a solvent including a ketone compound and having a content that is equal to or greater than 40 wt % and less than 90 wt %, quaternary ammonium salt, and primary amine.

15 Claims, 7 Drawing Sheets

(51) Int. Cl.

| | | |
|---|---|---|
| *C11D 7/26* | (2006.01) | |
| *C11D 7/08* | (2006.01) | |
| *C11D 7/32* | (2006.01) | |
| *C11D 11/00* | (2006.01) | |
| *H01L 21/683* | (2006.01) | |
| *H01L 23/00* | (2006.01) | |
| H01L 21/304 | (2006.01) | |
| H01L 21/306 | (2006.01) | |

(52) U.S. Cl.
CPC .............. *C11D 7/264* (2013.01); *C11D 7/266* (2013.01); *C11D 7/3209* (2013.01); *C11D 7/3218* (2013.01); *C11D 11/0047* (2013.01); *H01L 21/02057* (2013.01); *H01L 21/6835* (2013.01); *H01L 24/11* (2013.01); H01L 21/304 (2013.01); H01L 21/30604 (2013.01); H01L 21/30625 (2013.01); H01L 24/05 (2013.01); H01L 24/06 (2013.01); H01L 24/13 (2013.01); H01L 24/16 (2013.01); H01L 24/17 (2013.01); H01L 24/81 (2013.01); H01L 2221/68327 (2013.01); H01L 2221/68381 (2013.01); H01L 2224/03002 (2013.01); H01L 2224/0401 (2013.01); H01L 2224/0557 (2013.01); H01L 2224/05624 (2013.01); H01L 2224/05647 (2013.01); H01L 2224/06181 (2013.01); H01L 2224/1181 (2013.01); H01L 2224/13111 (2013.01); H01L 2224/13139 (2013.01); H01L 2224/13147 (2013.01); H01L 2224/16145 (2013.01); H01L 2224/16227 (2013.01); H01L 2224/17181 (2013.01); H01L 2224/81193 (2013.01); H01L 2224/81815 (2013.01); H01L 2224/94 (2013.01); H01L 2225/06513 (2013.01); H01L 2225/06517 (2013.01); H01L 2225/06541 (2013.01); H01L 2225/06565 (2013.01); H01L 2924/10252 (2013.01); H01L 2924/10253 (2013.01); H01L 2924/15311 (2013.01); H01L 2924/3512 (2013.01); H01L 2924/37001 (2013.01)

(58) Field of Classification Search
USPC ........................................................ 438/613
See application file for complete search history.

(56) References Cited

U.S. PATENT DOCUMENTS

| | | | |
|---|---|---|---|
| 8,882,853 B2 | 11/2014 | Son et al. | |
| 9,352,542 B2 | 5/2016 | Inao et al. | |
| 2014/0106137 A1* | 4/2014 | Kondo | ............... H01L 21/6835 |
| | | | 428/195.1 |
| 2015/0114429 A1 | 4/2015 | Jenq et al. | |
| 2016/0071762 A1 | 3/2016 | Kang et al. | |
| 2016/0326414 A1* | 11/2016 | Tagami | ................... C09J 183/10 |
| 2017/0069521 A1* | 3/2017 | Sugo | ....................... B32B 27/08 |
| 2017/0101555 A1* | 4/2017 | Yasuda | ..................... C09J 7/243 |
| 2017/0110360 A1* | 4/2017 | Tagami | ....................... C09J 7/22 |

FOREIGN PATENT DOCUMENTS

| | | |
|---|---|---|
| KR | 10-0664403 B1 | 1/2007 |
| KR | 10-0669866 B1 | 1/2007 |
| KR | 10-1128856 B1 | 3/2012 |
| KR | 10-1413079 B1 | 6/2014 |
| KR | 10-2015-0111529 A | 10/2015 |

* cited by examiner

METHOD OF MANUFACTURING A SEMICONDUCTOR DEVICE AND A CLEANING COMPOSITION FOR AN ADHESIVE LAYER

CROSS-REFERENCE TO RELATED APPLICATION

This U.S. non-provisional patent application claims priority under 35 U.S.C. § 119 to Korean Patent Application No. 10-2016-0170557, filed on Dec. 14, 2016, in the Korean Intellectual Property Office, the disclosure of which is hereby incorporated by reference in its entirety.

BACKGROUND

Embodiments of the inventive concepts relate to a method of processing a substrate, a method of cleaning a substrate, and a cleaning composition for an adhesive layer.

The number of electrode terminals of a semiconductor device has been increased and a pitch of the electrode terminals has been reduced. Thus, various methods of highly integrating semiconductor devices are being studied. A semiconductor substrate may be processed to reduce a thickness of the semiconductor substrate. However, it may be beneficial to maintain electrical characteristics of the semiconductor substrate during the processing of the semiconductor substrate.

SUMMARY

Embodiments of the inventive concepts may provide a method of processing a substrate, which is capable of improving a yield, and a cleaning composition used in the same.

In an aspect, a method of processing a substrate may include preparing a semiconductor substrate to which an adhesive layer adheres, removing the adhesive layer from the semiconductor substrate, and applying a cleaning composition to the semiconductor substrate to remove a residue of the adhesive layer. The cleaning composition may include a solvent including a ketone compound and having a content that is equal to or greater than 40 wt % and less than 90 wt %, quaternary ammonium salt, and primary amine.

In an aspect, a cleaning composition for an adhesive layer may include a solvent including a ketone compound and having a content that is equal to or greater than 40 wt % and less than 90 wt %, quaternary ammonium salt, and primary amine.

In an aspect, a method of processing a substrate may include preparing a semiconductor substrate to which an adhesive layer adheres; and applying a cleaning composition to the semiconductor substrate to remove the adhesive layer. The cleaning composition comprises: quaternary ammonium salt; and primary amine.

In an aspect, a method of processing a substrate may include providing a semiconductor substrate having a through-via, a pad, and a solder ball, wherein an adhesive layer adheres on a first surface of the semiconductor substrate and the solder ball; providing a cleaning composition on the semiconductor substrate; and removing an adhesive layer from the first surface of the semiconductor substrate and the solder ball with the cleaning composition. The cleaning composition comprises: a polar solvent including a ketone compound and having a content that is equal to or greater than 40 wt % and less than 90 wt %; quaternary ammonium salt; and primary amine.

BRIEF DESCRIPTION OF THE DRAWINGS

The inventive concepts will become more apparent in view of the attached drawings and accompanying detailed description.

DETAILED DESCRIPTION

Figure 1:
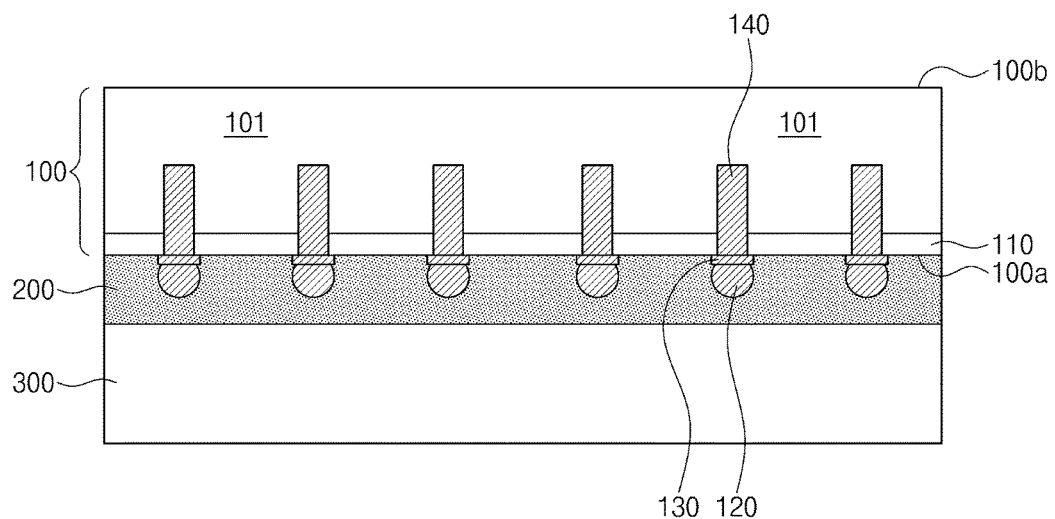
FIGS. 1 to 5, 6A, 7A, and 9 are cross-sectional views illustrating a method of processing a substrate, according to some embodiments of the inventive concepts.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that— examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g. "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present.

Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, encompass acceptable variations from exact identicality, including nearly identical layout, location, shapes, sizes, amounts, or other measures within acceptable variations that may occur, for example, due to manufacturing processes. The term "substantially" may be used herein to emphasize this meaning, unless the context or other statements indicate otherwise.

Unless otherwise defined, all terms (including technical and scientific terms) used herein have the same meaning as commonly understood by one of ordinary skill consistent with their meaning in the context of the relevant art and/or the present application.

Embodiments of the inventive concepts will be described hereinafter in detail.

FIGS. 1 to 5, 6A, 7A, and 9 are cross-sectional views illustrating a method of processing a substrate, according to some embodiments of the inventive concepts. FIG. 6B is an enlarged view of a region 'A' of FIG. 6A. FIG. 7B is an enlarged view of a region 'A' of FIG. 7A.

Figure 9:
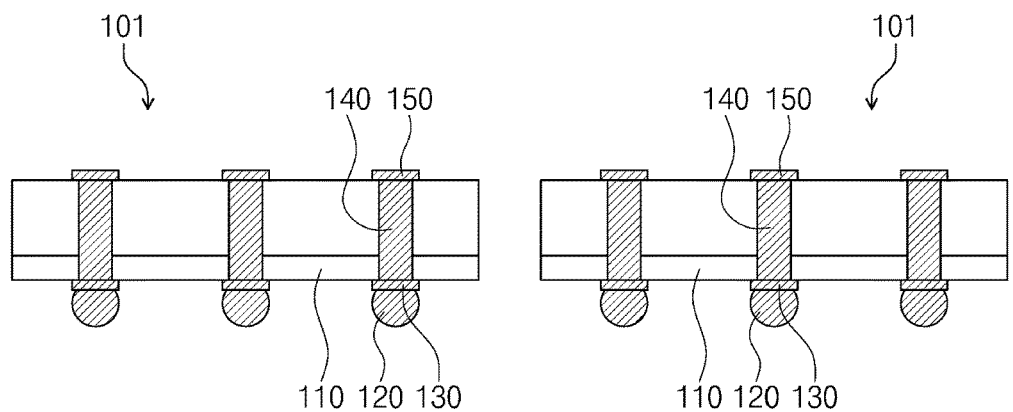

Referring to FIG. 1, a semiconductor substrate 100 may be provided. The semiconductor substrate 100 may have a first surface 100a and a second surface 100b which are opposite to each other. For example, the semiconductor substrate 100 may include silicon or germanium. The semiconductor substrate 100 may be a wafer-level substrate. The semiconductor substrate 100 may include a plurality of semiconductor chips 101. For example, in a later process, the semiconductor substrate 100 may be divided into a plurality of semiconductor chips 101 as shown in FIG. 9.

The semiconductor substrate 100 may include a circuit layer 110, solder balls 120, pads 130, and through-vias 140. The circuit layer 110 may be provided on the first surface 100a of the semiconductor substrate 100. The circuit layer 110 may include an integrated circuit. For example, the circuit layer 110 may include a memory circuit, a logic circuit, or a combination thereof. The through-vias 140 may penetrate at least a portion of the semiconductor substrate 100 from the first surface 100a of the semiconductor substrate 100. In some embodiments, the through-vias 140 may be spaced apart from the second surface 100b of the semiconductor substrate 100.

The solder balls 120 may be provided on the first surface 100a of the semiconductor substrate 100. The solder balls 120 may be electrically connected to the through-vias 140 and/or the integrated circuit of the circuit layer 110. The solder balls 120 may include tin, silver, copper, or any alloy thereof. The pads 130 may be disposed between the solder balls 120 and the through-vias 140, respectively. The pads 130 may include a metal such as copper or aluminum.

The semiconductor substrate 100 may be provided on a carrier substrate 300. At this time, the first surface 100a of the semiconductor substrate 100 may face the carrier substrate 300. The carrier substrate 300 may include glass. Alternatively, the carrier substrate 300 may include silicon. An adhesive layer 200 may be provided between the semiconductor substrate 100 and the carrier substrate 300. The adhesive layer 200 may cover the first surface 100a of the semiconductor substrate 100 and the solder balls 120. The semiconductor substrate 100 may be adhered to the carrier substrate 300 by the adhesive layer 200. The adhesive layer 200 may include a hardened insulating resin. For example, the adhesive layer 200 may be hardened after the adhesive layer 200 is disposed between the semiconductor substrate 100 and the carrier substrate 300. For example, the adhesive layer 200 may be disposed on either the semiconductor substrate 100 or the carrier substrate 300, and then the other substrate may be disposed on the adhesive layer 200 before hardening the adhesive layer 200. The adhesive layer 200 may include a compound having a carbonyl group. For example, the adhesive layer 200 may include acrylic polymer. Unlike FIG. 1, the adhesive layer 200 may include a plurality of layers. In this case, the plurality of layers may include the closest layer to the semiconductor substrate 100, and the closest layer may include acrylic polymer.

Figure 2:
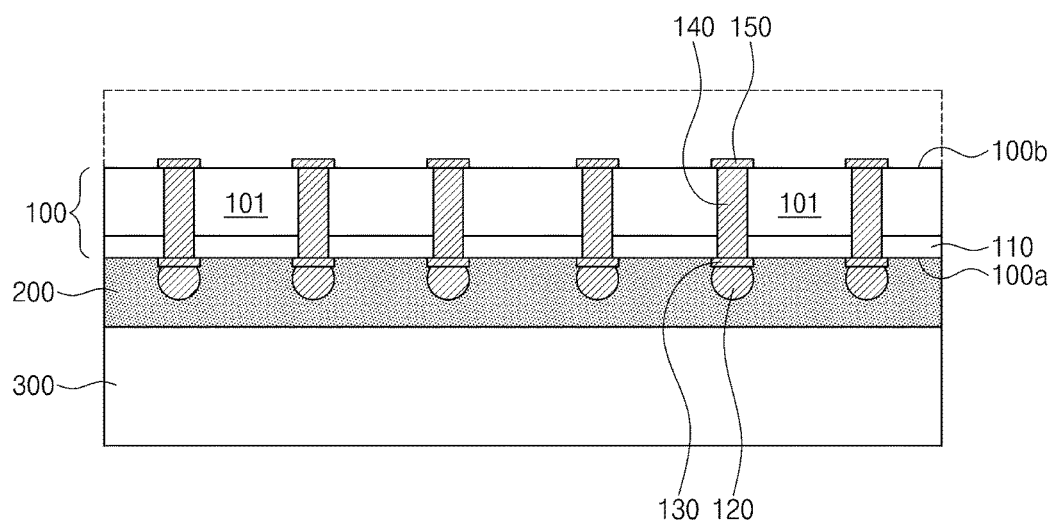

Referring to FIG. 2, a portion of the semiconductor substrate 100 may be removed to thin the semiconductor substrate 100. The process of thinning the semiconductor substrate 100 may include a polishing process, a grinding process or an etching process, which is performed on the second surface 100b of the semiconductor substrate 100. The polishing process may include a chemical mechanical polishing (CMP) process. The thinning process of the semiconductor substrate 100 may expose the through-vias 140 at the second surface 100b of the semiconductor substrate 100. A conductive pad 150 may be formed on the second surface 100b of the semiconductor substrate 100 so as to be connected to a through-via 140. When the semiconductor substrate 100 is processed, the thinned semiconductor substrate 100 may be easily handled by the carrier substrate 300. For example, the carrier substrate 300 may inhibit the semiconductor substrate 100 from being damaged by an external impact. For example, the carrier substrate 300 may protect the semiconductor substrate 100 from damage so that the carrier substrate 300 may help processing the semiconductor substrate 100 in the following steps of process or manufacture.

Figure 3:
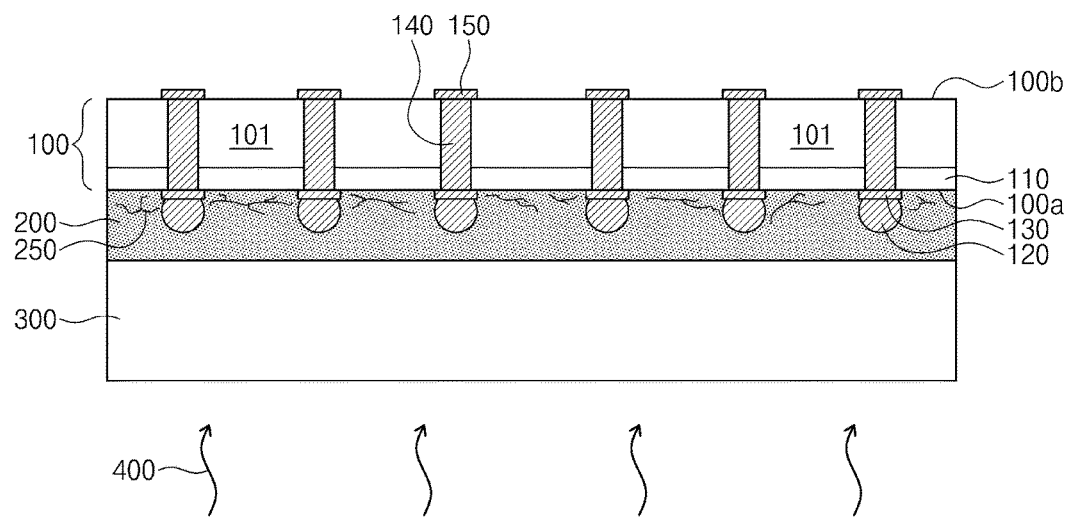

Referring to FIG. 3, a crack 250 may be formed in the adhesive layer 200. The crack 250 may be formed to remove the adhesive layer 200 in a subsequent process which will be described below with reference to FIG. 5. In some embodiments, light 400 may be irradiated to the adhesive layer 200 to form the crack 250. The light 400 may include ultraviolet. In certain embodiments, a physical impact may be applied to the adhesive layer 200 to form the crack 250. For example, in certain embodiments, a physical impact and/or a light energy (e.g., laser) may be applied to the adhesive layer 200 to form a crack 250 and/or to separate the semiconductor substrate 100 and the carrier substrate 300 from each other.

Figure 4:
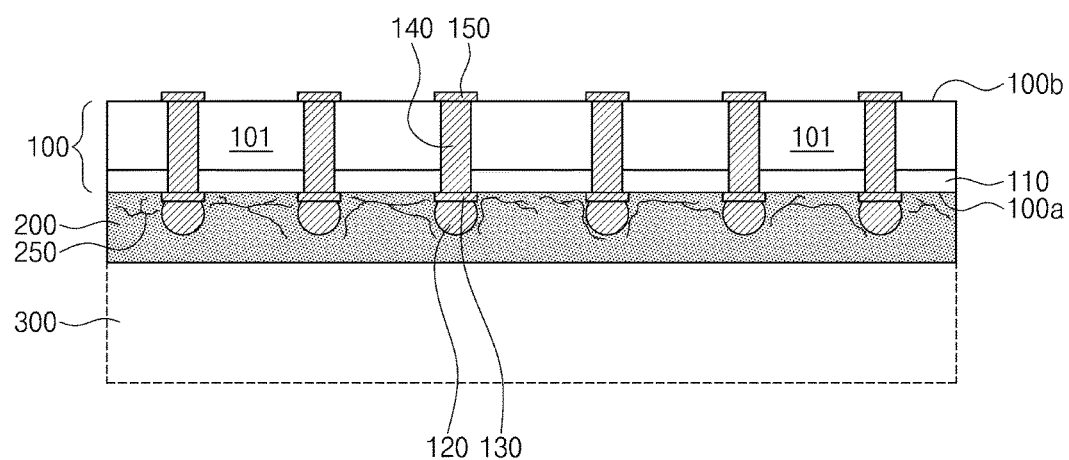

Referring to FIG. 4, the carrier substrate 300 may be removed from the semiconductor substrate 100 and/or the adhesive layer 200. For example, the carrier substrate 300 may be removed from the semiconductor substrate 100 and/or the adhesive layer 200 by a physical method, e.g., by a physical force. When the carrier substrate 300 is removed from the adhesive layer 200, the crack 250 may further propagate in the adhesive layer 200. For example, the crack 250 may propagate between the adhesive layer 200 and the carrier substrate 300.

Figure 5:
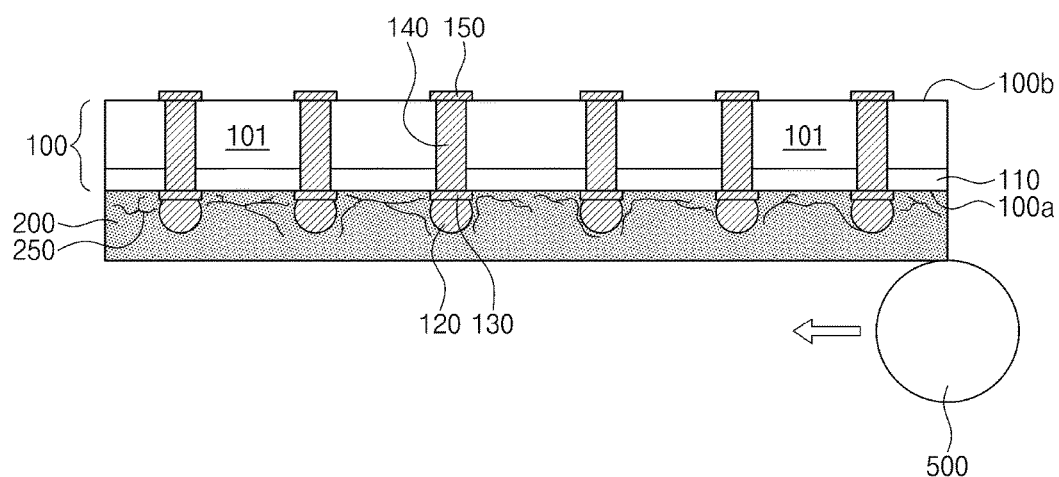

Referring to FIG. 5, the adhesive layer 200 may be removed from the semiconductor substrate 100. The adhesive layer 200 may be removed from the semiconductor substrate 100 by a physical method, e.g., by a physical force. For example, a rolling tape 500 may be provided on the adhesive layer 200. The adhesive layer 200 may be adhered to the rolling tape 500. Due to the crack 250, an adhesive strength between the adhesive layer 200 and the rolling tape 500 may be stronger than an adhesive strength between the adhesive layer 200 and the semiconductor substrate 100. The rolling tape 500 may horizontally move, e.g., on the adhesive layer 200. The rolling tape 500 may move to separate the adhesive layer 200 from the semiconductor substrate 100.

Figure 6A:
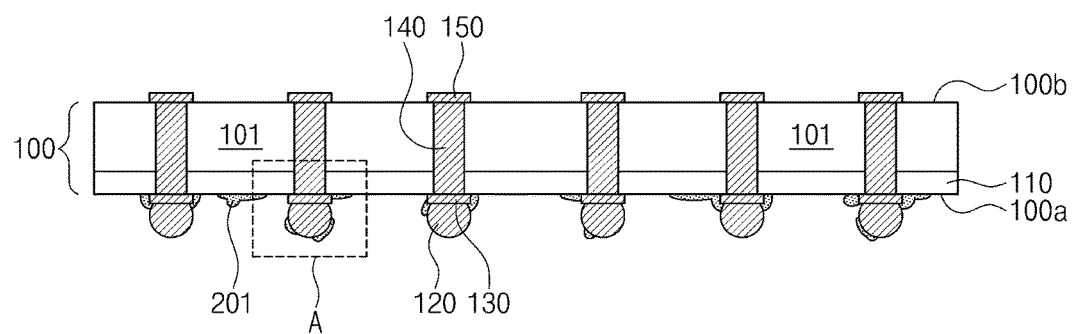
Figure 6B:
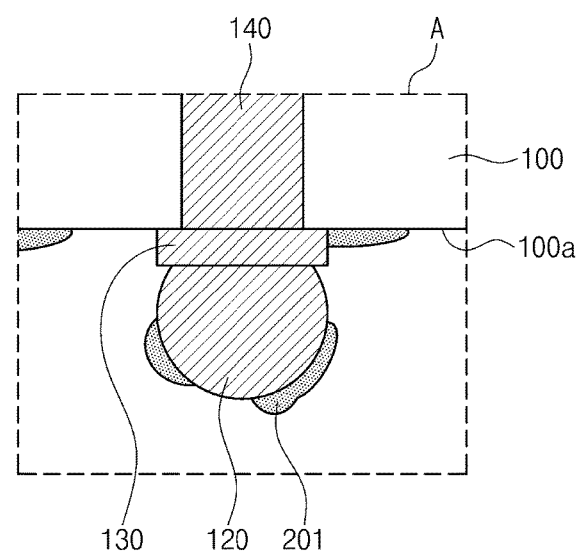
FIG. 6B is an enlarged view of a region 'A' of FIG. 6A.

Referring to FIGS. 6A and 6B, a portion of the adhesive layer 200 may remain on the semiconductor substrate 100 and the solder balls 120 to form a residue 201. For example, the residue 201 may leave on the first surface 100a of the semiconductor substrate 100 and the solder balls 120. The residue 201 may include the same material as the adhesive layer 200.

Figure 7A:
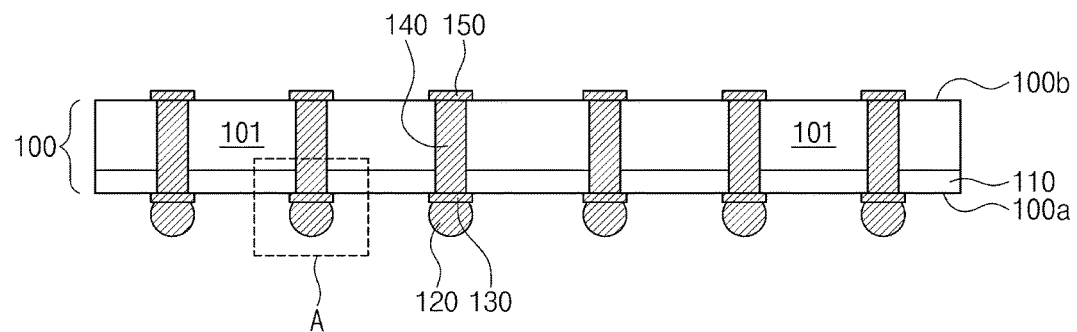
Figure 7B:
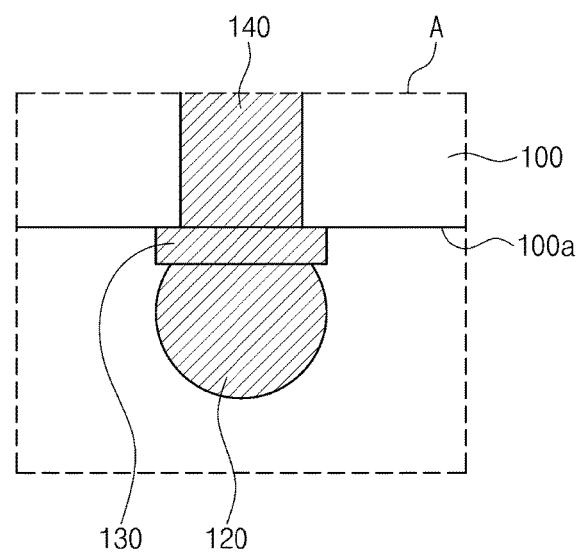
FIG. 7B is an enlarged view of a region 'A' of FIG. 7A.

Referring to FIGS. 7A and 7B, a cleaning process may be performed on the semiconductor substrate 100 to remove the residue 201. In the cleaning process, a cleaning composition may be provided on the first surface 100a of the semiconductor substrate 100. The cleaning composition may include a solvent, quaternary ammonium salt, and primary amine. For example, the quaternary ammonium salt may include tetramethylammonium phosphate, tetramethylammonium chloride, tetramethylammonium nitrate, dicyclohexyl amine nitride, dicyclohexylammonium nitride, or any combination thereof. The primary amine may include 2-aminoethanol, benzylamine, ethylene diamine, butyldiethanolamine, butylamine, cyclohexylamine, methylamine hydrochloride, 2-aminoethyl dihydrogen phosphate, methoxyamine hydrochloride, 2-aminoethyl hydrogen sulfate, 3-chloropropylamine hydrochloride, or any combination thereof.

The cleaning composition according to some embodiments and the cleaning process using the same will be described hereinafter in more detail.

Figure 8A:
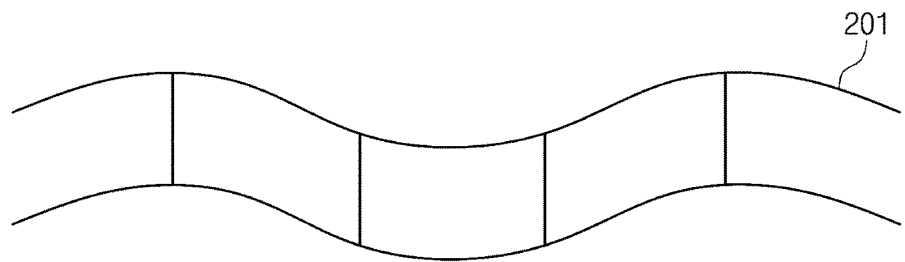
FIGS. 8A to 8C are schematic views illustrating a cleaning process according to some embodiments of the inventive concepts.
Figure 8B:
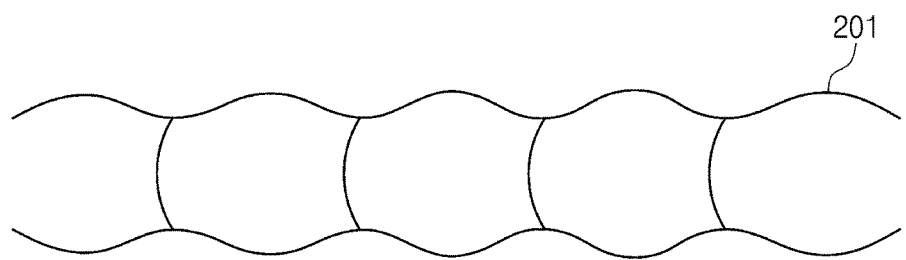
Figure 8C:
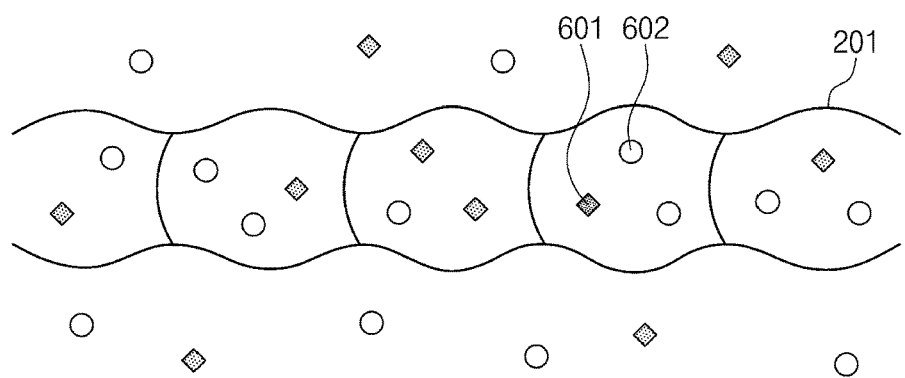

FIGS. 8A to 8C are enlarged views of the residue to illustrate the cleaning process according to some embodiments of the inventive concepts. The descriptions of the same features as the ones mentioned above will be omitted for the purpose of ease and convenience of explanation. The cleaning process will be described with reference to FIGS. 6A, 6B, 7A, and 7B as well as FIGS. 8A to 8C.

Referring to FIG. 8A, the residue 201 may include an insulating resin. For example, the residue 201 may include acrylic polymer. The residue 201 may have a chain or net structure.

Referring to FIG. 8B, the cleaning composition may be provided on the residue 201. As described above, the cleaning composition may include the solvent, the quaternary ammonium salt, and the primary amine. The solvent may have polarity. The solvent may permeate into the residue 201, and thus the residue 201 may swell. A content of the solvent in the cleaning composition may be equal to or greater than 40 wt % and less than 90 wt %. If the content of the solvent in the cleaning composition is less than 40 wt %, the residue 201 may not sufficiently swell. The solvent may include a ketone compound. For example, the ketone compound may include acetone, diacetonealcohol, acetophenone, cyclohexanone, methylethylketone, butylethylketone, heptylmethylketone, hexylmethylketone, or any combination thereof. The solvent may further include an acetate-based compound. The ketone compound and the acetate-based compound may have polarities. The acetate-based compound may include alkyl acetate or vinyl acetate. For example, the acetate-based compound may include at least one of methyl acetate, butyl acetate, ethyl acetate, pentyl acetate, octyl acetate, amyl acetate, heptyl acetate, n-decyl acetate, dodecyl acetate, pentin acetate, isobutyl acetate, vinyl acetate, isopropyl acetate, or ethylhexyl acetate. The acetate-based compound may not have toxicity.

The cleaning composition may further include an inorganic acid. The inorganic acid may include phosphoric acid, nitric acid, hydrofluoric acid, hydrochloric acid, iodic acid, bromic acid, acetic acid, perchloric acid, silicic acid, boric acid, fluoroboric acid, hexafluorophosphoric acid, or any combination thereof. The inorganic acid may adjust a pH of the cleaning composition. For example, the pH of the cleaning composition may be adjusted by adjusting a content of the inorganic acid. For example, the inorganic acid may have a content of 15 wt % or less in the cleaning composition. For example, the content of the inorganic acid in the cleaning composition may range from 1 wt % to 15 wt %. For example, the content of the inorganic acid in the cleaning composition may be greater than 2 wt % and equal to or less than 15 wt %. The pH of the cleaning composition may range from 7 to 8. The solder balls 120 and/or the pads 130 may be damaged by an alkaline or acidic solution. However, according to some embodiments of the inventive concepts, the pH of the cleaning composition may be adjusted to prevent or inhibit the solder balls 120 and/or the pads 130 (in FIGS. 6A and 6B) from being damaged. For example, a semiconductor manufacturing apparatus (not shown) may be damaged (e.g., corroded) by an alkaline solution. In this case, the pH of the cleaning composition may be adjusted to prevent or inhibit the semiconductor manufacturing apparatus from being damaged.

The cleaning composition may further include a hydroxy-benzene-based compound. The hydroxy-benzene-based compound may prevent or inhibit the solder balls 120 and/or the pads 130 from corroding during the cleaning process. The hydroxy-benzene-based compound may include at least one of phenol, 2-ethylphenol, 3-ethylphenol, 4-ethylphenol, 2-aminophenol, 2-fluorophenol, 4-aminophenol, 4-amino-2-nitrophenol, 2,4-dinitrophenol, 4-hydroxybenzenesulfonic acid, catechol, hydroquinone, pyrogallol, gallic acid, methylgallate, ethylgallate, n-propylgallate, or n-butylgallate. A content of the hydroxy-benzene-based compound may range 0.1 wt % to 20 wt % of the cleaning composition.

The cleaning composition may further include an amine compound. The amine compound may be different from the quaternary ammonium salt and the primary amine. For example, the amine compound may include 1,6-hexanediamine, triethanolamine, triethylamine, diisopropylamine, trimethylamine hydrochloride, or any combination thereof.

In certain embodiments, the cleaning composition may not include at least one of the acetate-based compound, the inorganic acid, the hydroxy-benzene-based compound, or the amine compound.

Referring to FIG. 8C, the quaternary ammonium salt 601 and the primary amine 602 may be provided into the residue 201. The quaternary ammonium salt 601 and the primary amine 602 may function as a remover of the residue 201. The residue 201 may react with the quaternary ammonium salt 601 and the primary amine 602 as the following chemical formula 1, and thus the residue 201 may be decomposed into imine.

[Chemical formula 1]

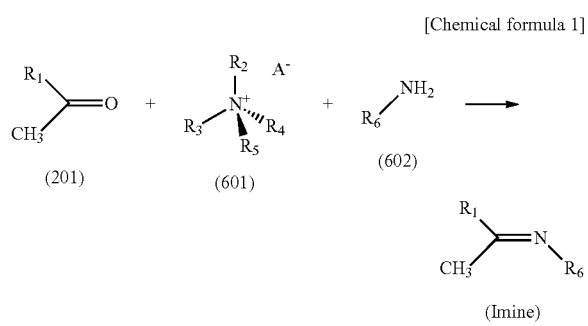

In the chemical formula 1, each of "$R_1$", "$R_2$", "$R_3$", "$R_4$", "$R_5$", and "$R_6$" may be independently selected from a group consisting of an alkyl group, an alkene group, an alkyne group, and an aromatic group. "$A^-$" may be a negative ion. For example, $A^-$ may be an anion present in the quaternary ammonium salt 601. For example, the quaternary ammonium salt 601 may include an ionic bond between a quaternary ammonium cation and an anion $A^-$.

The residue 201 may swell, and thus the quaternary ammonium salt 601 and the primary amine 602 may easily and quickly react with the residue 201. A sum of a content of the quaternary ammonium salt 601 and a content of the primary amine 602 may range 1 wt % to 30 wt % in the cleaning composition. If the sum of the contents of the quaternary ammonium salt 601 and the primary amine 602 is less than 1 wt %, the residue 201 may not be removed well. If the sum of the contents of the quaternary ammonium salt 601 and the primary amine 602 is greater than 30 wt %, the content of the solvent may be reduced. A weight ratio of the quaternary ammonium salt 601:the primary amine 602 may range from 3:1 to 1:3.

Since the solvent has polarity, the decomposed residue (e.g., imine) may be dissolved in the solvent. The decomposed residue may be exhausted to the outside through the solvent. For example, the decomposed residue may be removed from the semiconductor substrate 100 into the solvent. If the content of the solvent is less than 40 wt % in the cleaning composition, the decomposed residue may not be exhausted to the outside but may be re-adsorbed on the semiconductor substrate 100. For example, some of the decomposed residue may be re-attached on the semiconductor substrate 100 when the content of the solvent is not enough. If the content of the solvent is equal to or greater than 90 wt % in the cleaning composition, the contents of the quaternary ammonium salt 601 and the primary amine 602 may be reduced.

Referring again to FIGS. 7A and 7B, the residue 201 of FIGS. 6A and 8C may be removed by the cleaning process. At this time, the solder balls 120 may not be damaged (e.g., corroded) by the cleaning composition.

Referring to FIG. 9, the semiconductor substrate 100 may be sawed to separate the plurality of semiconductor chips 101 from each other. The sawing process may be performed along a scribe lane (not shown) of the semiconductor substrate 100.

Figure 10:
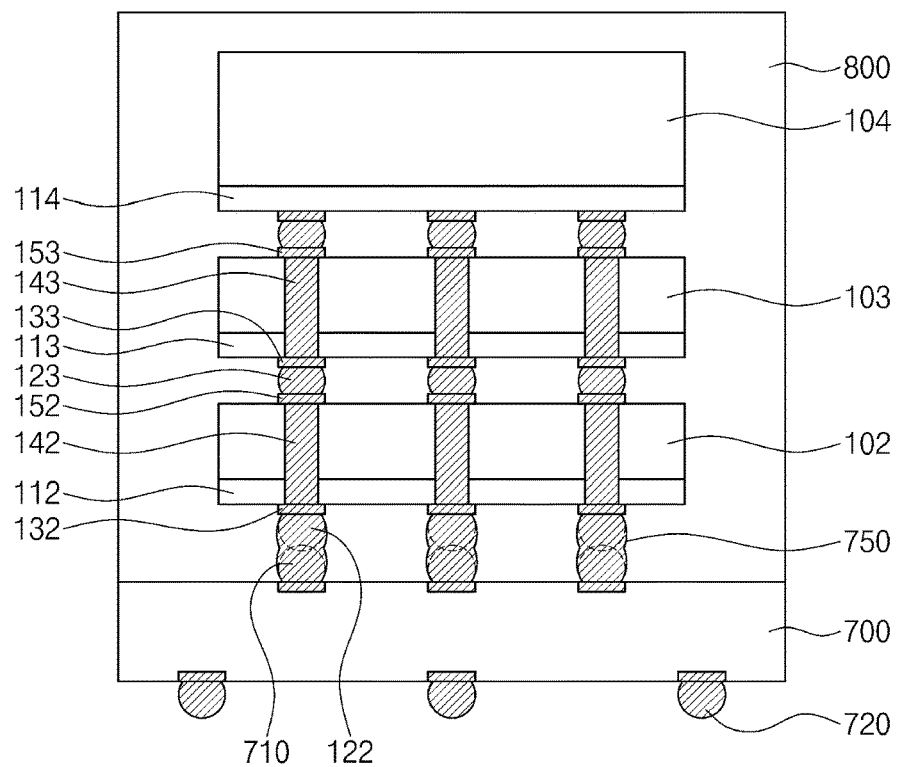
FIG. 10 is a cross-sectional view illustrating a semiconductor device according to some embodiments of the inventive concepts.

FIG. 10 is a cross-sectional view illustrating a semiconductor device according to some embodiments of the inventive concepts. Hereinafter, the descriptions of the same technical features as the ones mentioned above will be omitted or mentioned briefly for the purpose of ease and convenience of explanation.

Referring to FIG. 10, a semiconductor device 1 may include a package substrate 700, a first semiconductor chip 102, a second semiconductor chip 103, a third semiconductor chip 104, and a molding layer 800. The first semiconductor chip 102 and the second semiconductor chip 103 may be manufactured as described with reference to FIGS. 1 to 9. In some embodiments, the package substrate 700 may include a printed circuit board (PCB) or a semiconductor chip. A solder 710 may be provided on a top surface of the package substrate 700. An external terminal 720 may be provided on a bottom surface of the package substrate 700.

The first semiconductor chip 102 may be mounted on the package substrate 700. The first semiconductor chip 102 may include a first circuit layer 112, a first solder ball 122, a first pad 132, a first through-via 142, and a first conductive pad 152. The first circuit layer 112, the first solder ball 122, the first pad 132, the first through-via 142, and the first conductive pad 152 may be the same as the circuit layer 110, the solder ball 120, the pad 130, the through-via 140, and the conductive pad 150 described with reference to FIGS. 1 to 9, respectively. The first semiconductor chip 102 may be disposed on the package substrate 700 in such a way that the first solder ball 122 is aligned with the solder 710. A reflow process may be performed on the first solder ball 122 and the solder 710 to form a connection terminal 750. The connection terminal 750 may electrically connect the package substrate 700 and the first semiconductor chip 102 to each other. If the residue 201 remains on the first solder ball 122, electrical characteristics of the connection terminal 750 may be deteriorated. However, according to embodiments of the inventive concepts, the residue 201 may be removed by the cleaning process described with reference to FIGS. 8A to 8C, and thus the first semiconductor chip 102 may be stably electrically connected to the package substrate 700. Since the first solder ball 122 is not damaged in the cleaning process, electrical characteristics of the semiconductor device 1 may be improved. In addition, a manufacture yield of the semiconductor device 1 may be improved.

The second semiconductor chip 103 may include a second circuit layer 113, a second solder ball 123, a second pad 133, a second through-via 143, and a second conductive pad 153. The second circuit layer 113, the second solder ball 123, the second pad 133, the second through-via 143, and the second conductive pad 153 may be the same as the circuit layer 110, the solder ball 120, the pad 130, the through-via 140, and the conductive pad 150 described with reference to FIGS. 2 to 9, respectively. The second semiconductor chip 103 may be electrically connected to the first semiconductor chip 102 through the second solder ball 123 and the first conductive pad 152. In certain embodiments, an additional connection solder (not shown) may be formed between the second solder ball 123 and the first conductive pad 152, and a reflow process may be performed on the second solder ball 123 and/or the additional connection solder. The third semiconductor chip 104 may be mounted on the second semiconductor chip 103. The third semiconductor chip 104 may include a third circuit layer 114 but may not include a through-via. In certain embodiments, the third semiconductor chip 104 may include a through-via.

Hereinafter, the method of cleaning a substrate using the cleaning composition will be described with reference to experimental examples of the inventive concepts and comparative examples.

MANUFACTURE OF CLEANING COMPOSITION AND CLEANING OF SUBSTRATE

COMPARATIVE EXAMPLES

Cleaning compositions represented in the following tables 1 and 2 were manufactured. An adhesive layer was adhered to a semiconductor substrate. At this time, an acrylic polymer adhesive tape was used as the adhesive layer. The adhesive layer was removed from the semiconductor substrate. Each of the cleaning compositions was provided to the semiconductor substrate, and the semiconductor substrate was left at an environment of a temperature of 25 degrees Celsius to 50 degrees Celsius for a time of 1 minute to 30 minutes. Thereafter, the semiconductor substrate was cleaned using isopropyl alcohol and deionized water for 1 minute to remove a residue. A nitrogen gas was supplied to the semiconductor substrate to dry the semiconductor substrate. A removal rate of the residue was measured.

TABLE 1

| Comparative example | Kind and Content (wt %) of Cleaning composition | | | | | | | Removal rate of Residue (%) |
|---|---|---|---|---|---|---|---|---|
| | Solvent | | | | Remover | | | |
| | DMSO | EDG | NMP | BDG | TMAH | HDZ | HDA | |
| 1 | 85 | | | 5 | 1.25 | | 2.5 | 10 |
| 2 | 40 | | | 50 | 1.25 | | 2.5 | 8 |
| 3 | | 20 | | | | 2.4 | 12 | 15 |
| 4 | | 20 | | | | 12 | 24 | 21 |
| 5 | | | 3 | 20 | 6 | | 2.4 | 13 |
| 6 | | | 3 | 70 | 6 | | 2.4 | 20 |

DMSO: Dimethyl sulfoxide
EDG: Ethyl diglycol
NMP: N-methylpyrrolidone
BDG: Butyl di glycol
TMAH: Tetramethylammonium hydroxide
HDZ: Hydrazine
HDA: Hydroxyl amine

TABLE 2

| Comparative example | Kind and Content (wt %) of Cleaning composition | | | | | | | | | Removal rate of Residue (%) |
|---|---|---|---|---|---|---|---|---|---|---|
| | Solvent | | Hydroxy-benzene-based compound | | | Inorganic acid | Amine compound | Remover | | |
| | | | | | | | | Quaternary | | |
| | Ketone compound | Acetate compound | A | B | C | | | ammonium salt | Primary amine | |
| 7 | 53 | 24 | — | 6 | — | 10 | — | 7 | — | 30 |
| 8 | 46 | 24 | — | 6 | — | 10 | — | 14 | — | 55 |
| 9 | 53 | 24 | — | 6 | — | 10 | — | — | 7 | 45 |
| 10 | 46 | 24 | — | 6 | — | 10 | — | — | 14 | 70 |
| 11 | 68 | 24 | — | 6 | — | 1 | — | 0.5 | 0.5 | 35 |
| 12 | 66 | 24 | — | 6 | — | 2 | — | 1 | 1 | 40 |
| 13 | 6 | 24 | — | 6 | — | 30 | — | 17 | 17 | 60 |
| 14 | 20 | 24 | — | 6 | | 10 | | 20 | 20 | 60 |
| 15 | — | 86 | 2 | — | — | — | 12 | — | — | 90 |

Ketone compound: Methyl ethyl ketone
Acetate-based compound: Isopropyl acetate
Hydroxy-benzene-based compound A: Propyl gallate
Hydroxy-benzene-based compound B: Methyl gallate
Hydroxy-benzene-based compound C: Catechol
Inorganic acid: phosphoric acid
Amine compound: Ethylenediamine
Quaternary ammonium salt: Tetramethylammonium hydroxide
Primary amine: 2-Aminoethanol

EXPERIMENTAL EXAMPLES

An adhesive layer was formed and removed by the same methods as the comparative examples. Thereafter, a residue was removed using a cleaning composition, and a removal rate of the residue was measured. However, in the experimental examples, cleaning compositions represented in the following table 3 were used.

TABLE 3

| | Kind and Content (wt %) of Cleaning composition | | | | | | | | |
|---|---|---|---|---|---|---|---|---|---|
| | Solvent | | Hydroxy-benzene-based compound | | | | Remover | | Removal rate of |
| Experimental | Ketone | Acetate | | | | Inorganic | Amine | Quaternary ammonium | Primary | Residue |
| example | compound | compound | A | B | C | acid | compound | salt | amine | (%) |
| 1 | 50 | 24 | 2 | — | | 10 | — | 7 | 7 | 70 |
| 2 | 48 | 24 | — | 4 | — | 10 | — | 7 | 7 | 80 |
| 3 | 46 | 24 | — | 6 | — | 10 | — | 7 | 7 | 90 |
| 4 | 33 | 24 | | 6 | | 10 | | 13.5 | 13.5 | 80 |
| 5 | 46 | 24 | — | 6 | — | 10 | — | 3.5 | 10.5 | 75 |
| 6 | 46 | 24 | — | 6 | | 10 | | 10.5 | 3.5 | 80 |
| 7 | 64 | 24 | — | — | 6 | 2.5 | | 1.25 | 1.25 | 65 |
| 8 | 58 | 24 | — | — | 6 | 5 | | 3.50 | 3.50 | 75 |
| 9 | 16 | 24 | — | — | | 25 | | 14.5 | 14.5 | 70 |

Ketone compound: Methyl ethyl ketone
Acetate-based compound: Isopropyl acetate
Hydroxy-benzene-based compound A: Propyl gallate
Hydroxy-benzene-based compound B: Methyl gallate
Hydroxy-benzene-based compound C: Catechol
Inorganic acid: phosphoric acid
Amine compound: Ethylenediamine
Quaternary ammonium salt: Tetramethylammonium hydroxide
Primary amine: 2-Aminoethanol Referring to the tables 1 to 3 and FIGS. 6A, 6B, 7A, and 7B, the removal rates of the residues 201 of the experimental examples are higher than the removal rates of the residues 201 of the comparative examples. The cleaning compositions of the comparative examples 1 to 6 includes dimethyl sulfoxide (DMSO), ethyl diglycol (EDG), N-methylpyrrolidone (NMP), and/or butyl di glycol (BDG) as solvents. However, the cleaning compositions of the experimental examples includes ketone compounds and acetate compounds as solvents, and thus the removal rates of the residues 201 of the experimental examples were improved.

The cleaning compositions of the comparative examples 7 to 10 does not include one of quaternary ammonium salt and primary amine. However, each of the cleaning compositions of the experimental examples includes the quaternary ammonium salt and the primary amine, and thus the removal rates of the residue 201 were improved.

In the comparative examples 11 and 12, contents of the solvents were 90 wt % or greater in the cleaning compositions. When the content of the solvent is equal to or greater than 90 wt % in the cleaning composition, a content of the remover may be reduced, e.g., less than 10 wt %. However, the contents of the solvents were less than 90 wt % in the cleaning compositions of the experimental examples, and thus the removal rates of the residue 201 were improved. For example, for a better residue removal, it is beneficial that the solvent contents of the cleaning composition may be less than 90 wt % of the whole composition.

In the comparative examples 13 and 14, contents of removers were greater than 30 wt % in the cleaning compositions. Here, the remover includes the quaternary ammonium salt and the primary amine. However, contents of the removers were equal to or less than 30 wt % in the cleaning compositions of the experimental examples. Thus, the removal rates of the residue 201 were improved.

In the comparative example 13, a content of the solvent was less than 40 wt % in the cleaning composition. If the content of the solvent is less than 40 wt % in the cleaning composition, the residue may not sufficiently swell or the decomposed residue may be re-adsorbed on the semiconductor substrate 100. However, since the contents of the solvents are equal to or greater than 40 wt % in the cleaning compositions of the experimental examples, the removal rates of the residue 201 may be improved.

The comparative example 15 showed a relatively high removal rate of the residue 201. However, a semiconductor manufacturing apparatus was damaged by the cleaning composition of the comparative example 15. The cleaning composition of the comparative example 15 did not include the inorganic acid, and thus the cleaning composition of the comparative example 15 showed alkalinity. For example, a pH of the cleaning composition of the comparative example 15 was greater than 8. However, the cleaning compositions of the experimental examples included the inorganic acids, and thus each of the cleaning compositions of the experimental examples had a pH of 7 to 8. In the experimental examples, the semiconductor manufacturing apparatus was not damaged. For example, when the cleaning compositions of the experimental examples include inorganic acids, the semiconductor manufacturing apparatus may not be damaged.

The removal rates of the residues 201 of the comparative examples 7 to 15 are higher than the removal rates of the residues 201 of the comparative examples 1 to 6. The solvents of the comparative examples 7 to 15 include the ketone compound and/or the acetate compound. Thus, the removal rates of the comparative examples 7 to 15 may be higher than the removal rates of the comparative examples 1 to 6. For example, a cleaning composition including ketone compound and/or acetate compound may have higher removal rate of residue 201.

Cleaning compositions according to embodiments of the inventive concepts may have high removal rates with respect to the residue of the adhesive layer. The cleaning compositions may quickly remove the residue of the adhesive layer. The cleaning compositions may not damage the solder ball and/or the pad of the semiconductor substrate. Thus, a processing yield of the semiconductor substrate may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing descriptions.

What is claimed is:

1. A method of manufacturing a semiconductor device, the method comprising:
   preparing a semiconductor substrate to which an adhesive layer adheres;
   removing the adhesive layer from the semiconductor substrate; and
   applying a cleaning composition to the semiconductor substrate to remove a residue of the adhesive layer,
   wherein the cleaning composition comprises:
   a solvent including a ketone compound, the solvent having a ketone content equal to or greater than 40 wt % and less than 90 wt %;
   quaternary ammonium salt; and
   primary amine.

2. The method of claim 1, wherein the solvent further includes an acetate-based compound.

3. The method of claim 1, wherein a sum of a content of the quaternary ammonium salt and a content of the primary amine ranges from 1 wt % to 30 wt % of the cleaning composition.

4. The method of claim 1, wherein the removing of the adhesive layer comprises:
   irradiating light to the adhesive layer to form a crack in the adhesive layer; and
   separating the adhesive layer from the semiconductor substrate by a physical method.

5. The method of claim 1, wherein the preparing of the semiconductor substrate comprises:
   forming the adhesive layer on a first surface of the semiconductor substrate; and
   disposing a carrier substrate on the first surface of the semiconductor substrate,
   wherein the adhesive layer is provided between the semiconductor substrate and the carrier substrate.

6. The method of claim 5, further comprising:
   performing a thinning process on a second surface of the semiconductor substrate,
   wherein the second surface of the semiconductor substrate is opposite to the first surface of the semiconductor substrate.

7. The method of claim 1, wherein the residue includes acrylic polymer.

8. The method of claim 1, wherein the cleaning composition further comprises at least one of an inorganic acid, a hydroxy-benzene-based compound, or an amine compound, and
   wherein the amine compound includes a material different from the quaternary ammonium salt and the primary amine.

9. The method of claim 1, wherein a pH of the cleaning composition ranges from 7 to 8.

10. The method of claim 1, wherein the solvent has polarity.

11. The method of claim 1, wherein the ketone compound includes acetone, diacetonealcohol, acetophenone, cyclohexanone, methylethylketone, butylethylketone, heptylmethylketone, hexylmethylketone, or any combination thereof.

12. The method of claim 1, wherein the preparing of the semiconductor substrate comprises:
    forming a solder ball on a first surface of the semiconductor substrate; and
    forming the adhesive layer on the first surface of the semiconductor substrate,
    wherein the adhesive layer covers the solder ball.

13. A method of manufacturing a semiconductor device, the method comprising:
    preparing a semiconductor substrate to which an adhesive layer adheres; and
    applying a cleaning composition to the semiconductor substrate to remove the adhesive layer,
    wherein the cleaning composition comprises:
    quaternary ammonium salt; and
    primary amine,
    wherein the cleaning composition further comprises a solvent including a ketone compound and having a content that is equal to or greater than 40 wt % and less than 90 wt %.

14. The method of claim 13, wherein the cleaning composition further comprises:
    a hydroxyl-benzene-based compound having a content that ranges from 0.1 wt % to 20 wt % of the cleaning composition; and
    an inorganic acid having a content that ranges from 1 wt % to 15 wt % of the cleaning composition.

15. The method of claim 13, wherein the removing of the adhesive layer comprises:
    separating the adhesive layer from the semiconductor substrate; and
    removing a residue of the adhesive layer from the semiconductor substrate with the cleaning composition.

* * * * *